(12) United States Patent
Hauser et al.

(10) Patent No.: US 7,192,885 B2
(45) Date of Patent: Mar. 20, 2007

(54) METHOD FOR TEXTURING SURFACES OF SILICON WAFERS

(75) Inventors: Alexander Hauser, Constance (DE); Ihor Melnyk, Lwiw (UA); Peter Fath, Constance (DE)

(73) Assignee: Universitat Konstanz, Constance (DE)

( * ) Notice: Subject to any disclaimer, the term of this patent is extended or adjusted under 35 U.S.C. 154(b) by 0 days.

(21) Appl. No.: 10/555,141

(22) PCT Filed: Apr. 22, 2004

(86) PCT No.: PCT/DE2004/000835

§ 371 (c)(1),
(2), (4) Date: Oct. 31, 2005

(87) PCT Pub. No.: WO2004/100244

PCT Pub. Date: Nov. 18, 2004

(65) Prior Publication Data

US 2006/0068597 A1    Mar. 30, 2006

(30) Foreign Application Priority Data

May 7, 2003   (DE)  ............................... 103 202 212

(51) Int. Cl.
  *H01L 21/461*  (2006.01)
  *H01L 21/302*  (2006.01)
  *H01L 21/00*   (2006.01)

(52) U.S. Cl. .................... 438/753; 438/745; 438/21; 438/3; 216/13; 216/83; 216/87; 216/96; 216/99; 257/E21.219; 257/E21.223

(58) Field of Classification Search ................ 438/753, 438/745, 3, 21; 216/21, 13, 83, 87, 96, 99; 134/3
See application file for complete search history.

(56) References Cited

U.S. PATENT DOCUMENTS

| 3,309,760   | A  |   | 3/1967  | Reznick et al.              |
|-------------|----|---|---------|-----------------------------|
| 5,174,855   | A  |   | 12/1992 | Tanaka                      |
| 5,681,398   | A  |   | 10/1997 | Muraoka                     |
| 6,309,467   | B1 |   | 10/2001 | Wochner et al.              |
| 6,340,640   | B1 | * | 1/2002  | Nishimoto et al. ... 438/753 |
| 2002/0187583| A1 |   | 12/2002 | Chang et al.                |

FOREIGN PATENT DOCUMENTS

DE   199 62 136 A1    6/2001
JP   05291215         11/1993

* cited by examiner

*Primary Examiner*—Michael Lebentritt
*Assistant Examiner*—Mohsen Ahmadi
(74) *Attorney, Agent, or Firm*—Baker & Daniels LLP

(57) ABSTRACT

A method for texturing surfaces of silicon wafers comprising the steps of dipping the silicon wafers in an etching solution of water, concentrated hydrofluoric acid and concentrated nitric acid and setting a temperature for the etching solution. The etching solution comprises, in percent, 20% to 55% water, 10% to 40% concentrated hydrofluoric acid and 20% to 60% concentrated nitric acid and the temperature of the etching solution is between 0 and 15 degrees Celsius.

9 Claims, 6 Drawing Sheets

METHOD FOR TEXTURING SURFACES OF SILICON WAFERS

BACKGROUND OF THE INVENTION

The invention concerns a method for texturing surfaces of silicon wafers comprising the steps of dipping the silicon wafers in an etching solution of water, concentrated hydrofluoric acid and concentrated nitric acid and setting a temperature for the etching solution.

A method of this kind is known from the article "Isotropic texturing of polycrystalline silicon wafers with acidic texturing solutions," by R. Einhaus, E. Vazsonyi, J. Szlufcik et al., published in the Proceedings of the 26th PVSC, Sep. 30 to Oct. 3, 1997, Anaheim, Calif., U.S.A. In this prior method, polycrystalline silicon wafers are surface-textured in a temperature-controlled acidic etching solution comprising water, hydrofluoric acid in a concentration of 50%, and nitric acid in a concentration of 70% to reduce reflections that compromise efficiency.

Known from the documents U.S. Pat. No. 3,309,760, US 2002/0187583 A1, U.S. Pat. No. 5,681,398 and U.S. Pat. No. 5,174,855 are methods for treating surfaces of silicon wafers in order to prepare silicon for a metallization step, develop a structure, and, in the case of the last-cited documents, effect cleaning.

The object of the invention is to specify a method of the kind cited at the beginning hereof that is comparatively simple to perform, particularly on an industrial scale, and yields silicon wafers of improved efficiency.

SUMMARY OF THE INVENTION

This object is achieved according to the invention, in a method of the aforesaid kind, in that the etching solution comprises, in percent, 20% to 55% water, 10% to 40% concentrated hydrofluoric acid and 20% to 60% concentrated nitric acid and in that the temperature of the etching solution is between 0 and 15 degrees Celsius.

By virtue of the inventive composition of the etching solution comprising, in percent, 20% to 55% water, 10% to 40% concentrated hydrofluoric acid and 20% to 60% concentrated nitric acid, and additionally the fact that the etching process is carried out at a relatively low etching bath temperature well below room temperature, an appreciable improvement in efficiency is achieved. Moreover, the mixing of the etching solution, in the first place, proves to be relatively noncritical and can be performed in a relatively short period of time. In the second place, the etching process is relatively easy to monitor.

In an improvement of the inventive method, the etching solution comprises, in percent, 30% to 40% water, 15% to 30% concentrated hydrofluoric acid and 30% to 50% concentrated nitric acid.

In a further refinement of the inventive method, the temperature of the etching solution is between 7 and 9 degrees Celsius.

Advantageously, in the inventive method the silicon wafers remain in the etching solution for between 3 and 5 minutes.

In a particularly preferred exemplary embodiment of the inventive method, the etching solution comprises, in percent, 31% water, 23% concentrated hydrofluoric acid and 46% concentrated nitric acid, the temperature of the etching solution is 8 degrees Celsius, and the silicon wafers remain in the etching solution for between 1.5 and 2 minutes.

In one embodiment of the inventive method, the silicon wafers are oriented substantially vertically and the etching solution has a flow component. Both surfaces of the silicon wafers are thereby textured in substantially the same manner.

In a further advantageous embodiment of the inventive method, the silicon wafers are oriented substantially horizontally and the etching solution is quiescent. In this way, the upward-facing surface is textured particularly well by gas bubbles that effervesce away relatively quickly.

In a further improvement of the last-cited embodiment that is particularly advantageous for the continuous production of silicon wafers, the silicon wafers are moved through the etching solution. This results in particularly good texturing on both faces of the silicon wafers.

In the inventive method, the silicon wafers are advantageously polycrystalline.

BRIEF DESCRIPTION OF THE DRAWINGS

The above mentioned and other features and objects of this invention, and the manner of attaining them, will become more apparent and the invention itself will be better understood by reference to the following description of embodiments of the invention taken in conjunction with the accompanying drawings, wherein.

Figure 1:
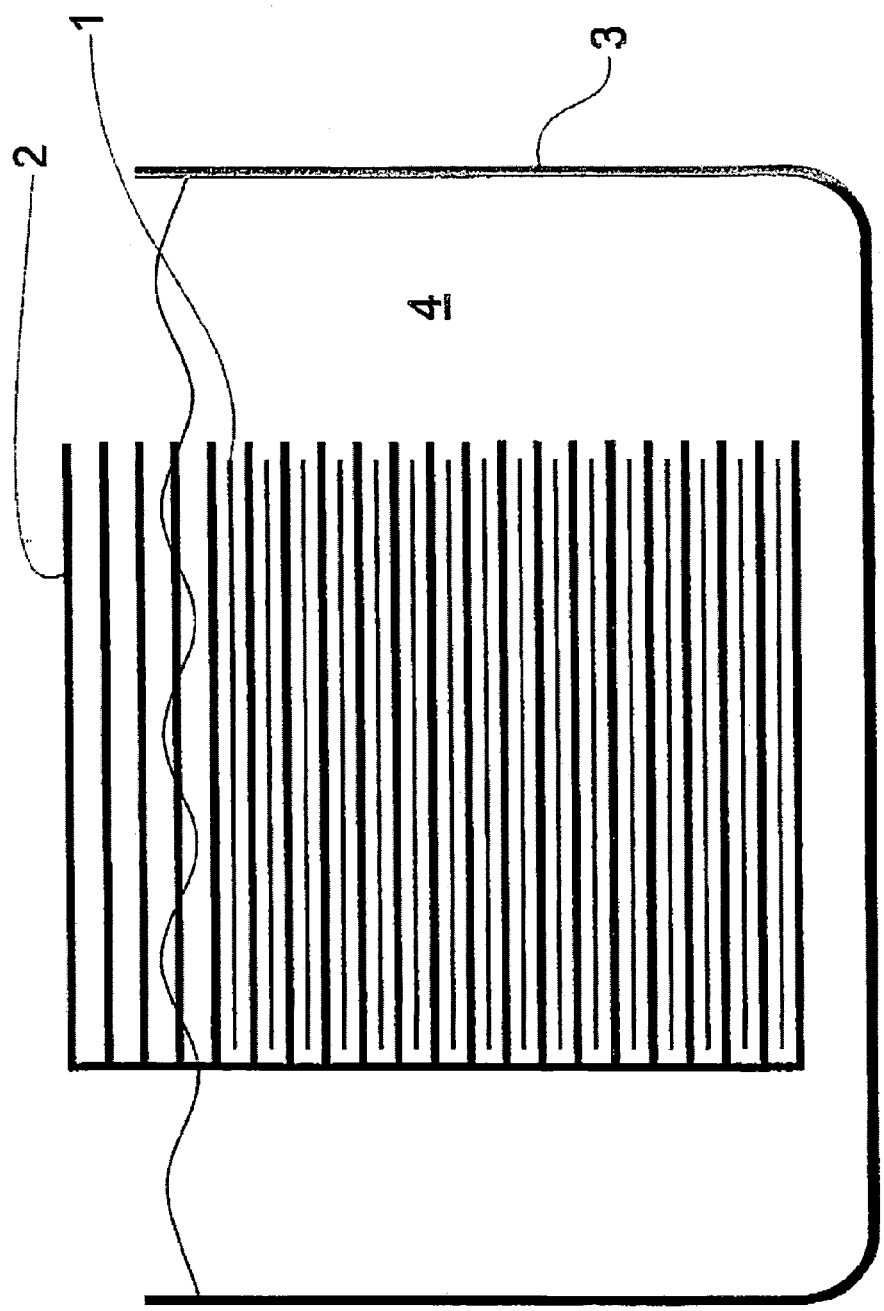
FIG. 1 is a schematic diagram of the arrangement of silicon wafers in an inventive etching solution according to a first exemplary embodiment.

Corresponding reference characters indicate corresponding parts throughout the several views. Although the exemplifications set out herein illustrate embodiments of the invention, in several forms, the embodiments disclosed below are not intended to be exhaustive or to be construed as limiting the scope of the invention to the precise forms disclosed.

DESCRIPTION OF THE PRESENT INVENTION

FIG. 1 is a schematic diagram of a number of polycrystalline silicon wafers 1 implemented as "wafers" and connected in a known manner to a holder 2. In the diagram of FIG. 1, holder 2, with the silicon wafers 1 oriented horizontally, is dipped in a tank 3 filled with a quiescent inventive etching solution 4. This horizontal arrangement causes gas bubbles that evolve on the upward-facing surface of the silicon wafers 1 during the etching process to effervesce upward, resulting in texturing on the upper surface of the silicon wafers 1 that is very effective in reducing reflection.

Figure 2:
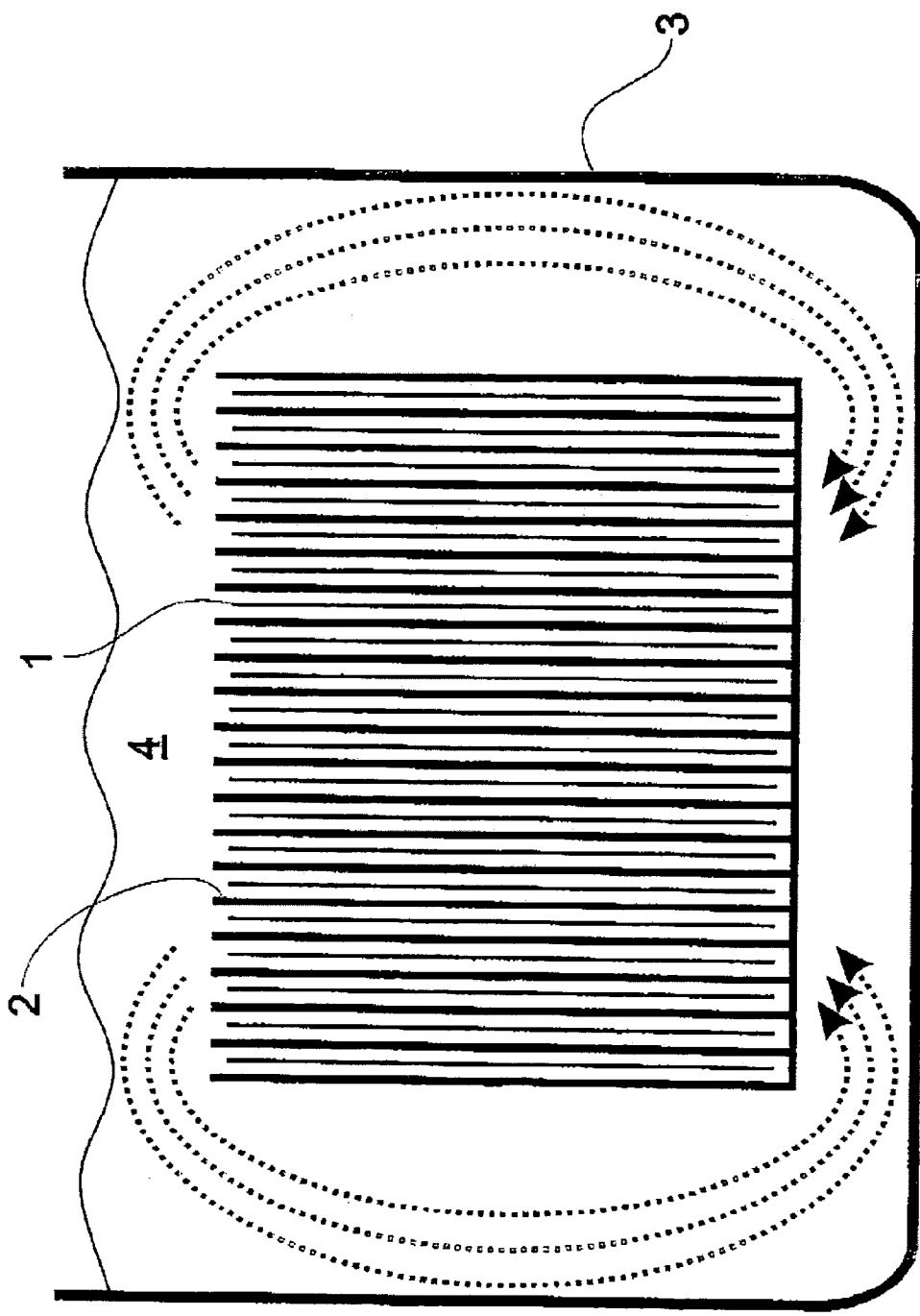
FIG. 2 is a schematic diagram of the arrangement of silicon wafers in an inventive etching solution according to a second exemplary embodiment.

FIG. 2 shows in schematic representation the arrangement of a silicon wafer connected to a holder 2 corresponding to the exemplary embodiment of FIG. 1, in an inventive etching solution 4 conforming to a second exemplary embodiment. In the second exemplary embodiment, the silicon wafers 1 are arranged vertically and the etching solution 4 has a flow component, indicated by dotted flow lines, along the silicon wafers 1; this is produced, for example, by moving the tank 3 back and forth or by the use of a stirring tool (not shown in FIG. 2) resistant to strong acids. In this way, gas bubbles forming on both surfaces of the silicon wafers 1 during the etching process are made to detach and effervesce upward at an early stage, causing both faces of the silicon wafers 1 to be textured uniformly.

Figure 3:
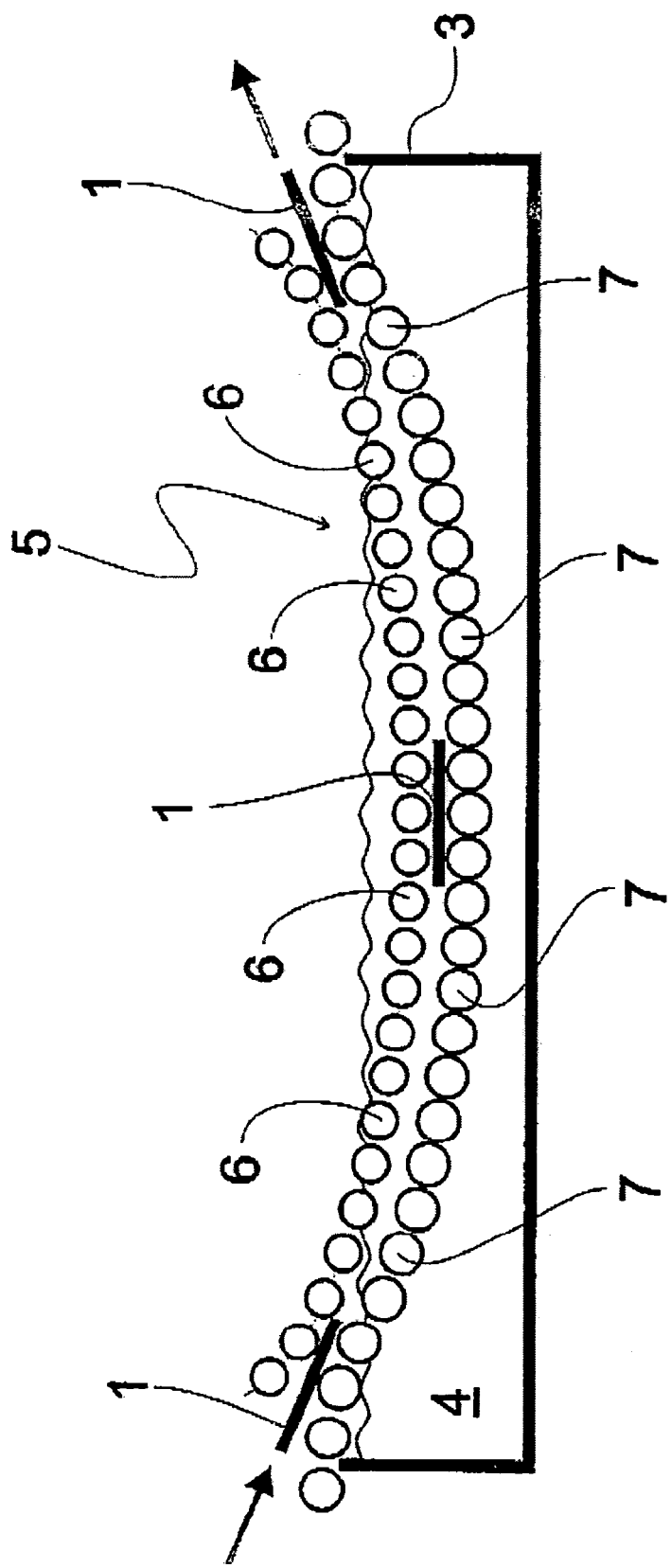
FIG. 3 is a schematic diagram of the arrangement of silicon wafers in an inventive etching solution according to a third exemplary embodiment.

FIG. 3 shows in schematic representation the arrangement of silicon wafers 1 in an inventive etching solution 4 according to a third exemplary embodiment. In the exemplary embodiment of FIG. 3, a roller conveyor 5 is present that comprises a number of spacedly mutually confronting, at least partially driven upper rollers 6 and lower rollers 7 by means of which the silicon wafers 1 to be textured are conducted in a substantially horizontal path through the inventive etching solution 4 held in the tank 3. This exemplary embodiment is distinguished by being particularly suitable for the continuous production of silicon wafers 1 while providing very good texturing of both faces.

The composition of an exemplary inventive etching solution 4, comprising water, concentrated hydrofluoric acid—i.e., having a concentration of at least approximately 50%—and concentrated nitric acid—i.e., having a concentration of at least approximately 65%,—is as follows, it being understood that if other hydrofluoric acid and nitric acid concentrations are used, the proportions are to be adjusted accordingly:

2 parts water ($H_2O$),
1.5 parts hydrofluoric acid (HF, concentration 50%) and
3 parts nitric acid ($HNO_3$, concentration 65%).

In the exemplary embodiments depicted in FIGS. 1 to 3, the temperature of the etching solution 4 is maintained according to the invention between about 0 and about 15 degrees Celsius, preferably between about 7 and about 9 degrees Celsius.

Assuming undepleted etching solution 4, this results in a process time for texturing of about 3 minutes initially, increasing to about 5 minutes after the texturing of 550 silicon wafers 1 measuring 12.5×12.5 $cm^2$ in roughly 12 liters of etching solution 4.

In a particularly preferred exemplary embodiment,
4 parts water ($H_2O$),
3 parts hydrofluoric acid (HF, concentration 50%) and
6 parts nitric acid ($HNO_3$, concentration 65%)

are used, the temperature of the etching solution 4 being maintained at about 8 degrees Celsius. The process time in this particularly preferred exemplary embodiment is between 1.5 and 2 minutes.

The etching process is monitored by weighing textured silicon wafers 1 before and after the etching process, the correct duration of the etching process being indicated by a set nominal weight loss that depends on the size of the silicon wafer 1 concerned and the desired material removal. If the actual weight loss is below the nominal weight loss, the duration of the etching process is increased until the actual weight loss equals the nominal weight loss. Correspondingly, if the actual weight loss is above the nominal weight loss, the duration of the etching process is decreased until the actual weight loss equals the nominal weight loss.

Figure 4:
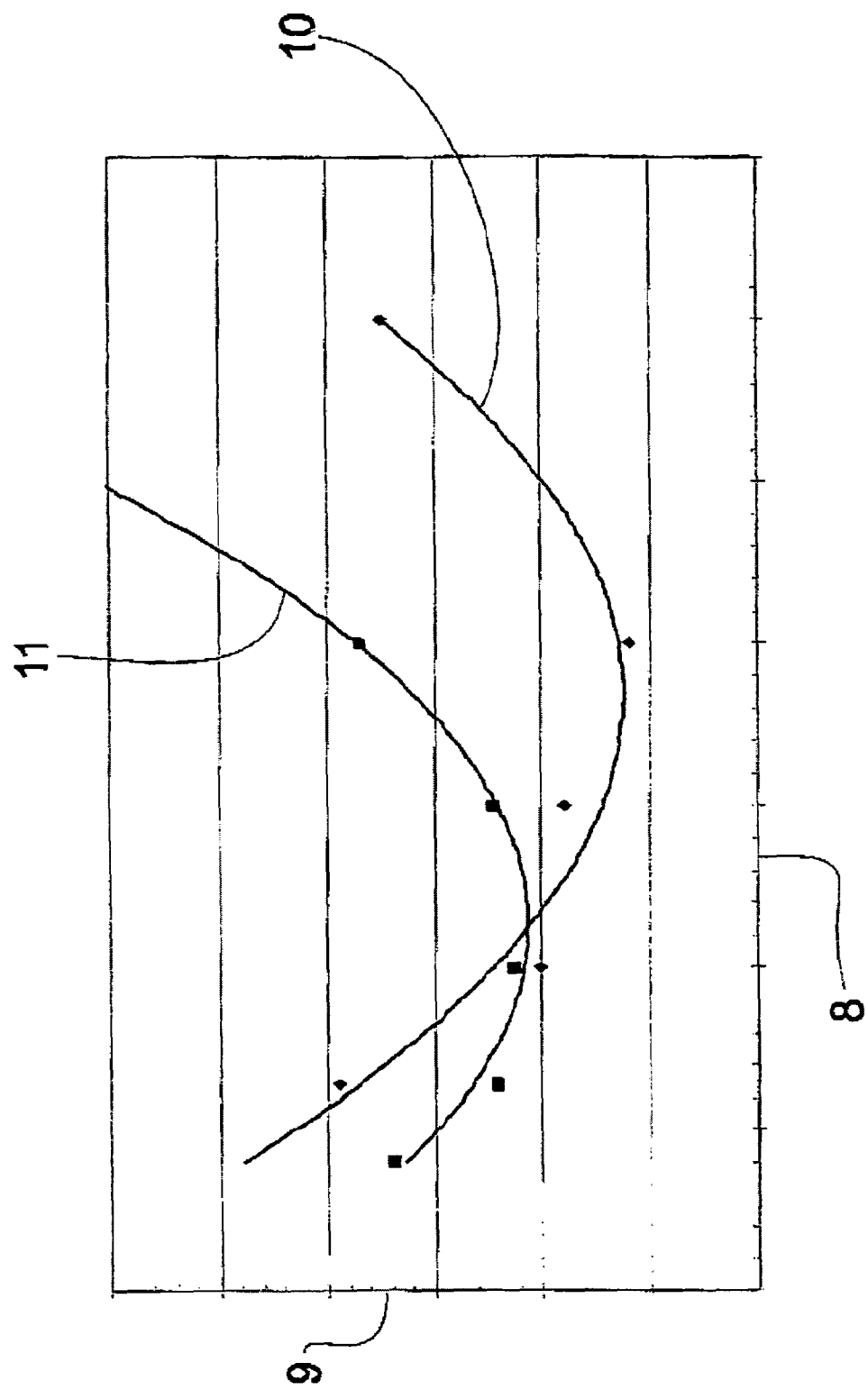
FIG. 4 is a graph of the qualitative dependence of average reflectance on etching time for an etching process employing an etching solution at room temperature and an etching process employing an inventive etching solution in the inventive temperature range.

FIG. 4 is a graph of the qualitative dependence of average reflectance on etching time for a comparison method using an etching solution at room temperature and for an etching process using an inventive etching solution within the inventive temperature range.

In the graph of FIG. 4, the etching time is plotted on the abscissa 8. Plotted on the ordinate 9 is the average reflectance, averaged over a wavelength range of 400 nm to 1100 nm. The values approximated by a first approximation curve 10 derive from silicon wafers 1 textured by the inventive method. The measurement values approximated by a second approximation curve 11 derive from silicon wafers textured by a comparison method.

A comparison of the first approximation curve 10, pertaining to the method according to the invention, with the second approximation curve, for the comparison method, reveals that the average reflectance in the case of inventively textured silicon wafers 1 is appreciably lower than that obtained with silicon wafers textured by the comparison method.

Figure 5:
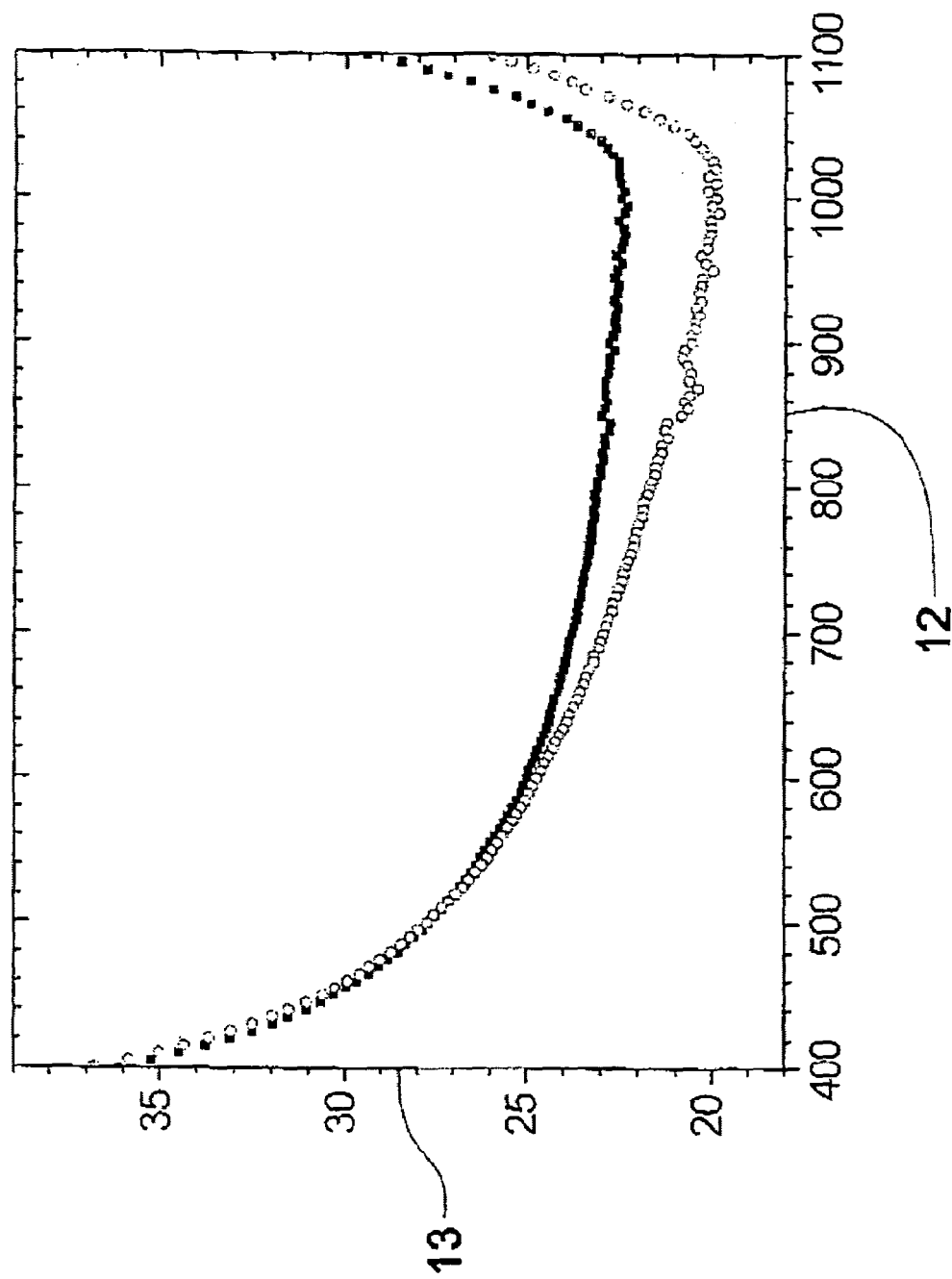
FIG. 5 is a graph of the dependence of reflectance on wavelength for a silicon wafer textured in a conventional acidic etching solution and an inventively textured silicon wafer.

FIG. 5 shows, in a graph, the dependence of reflectance on wavelength for a silicon wafer textured in a conventional acidic etching solution and an inventively textured silicon wafer 1.

In the graph of FIG. 5, the wavelength in nanometers is plotted on the abscissa 12 and the reflectance in percent on the ordinate 13. The empty circles represent measurement values from silicon wafers 1 textured by the inventive method using the above-specified exemplary etching solution 4, while the measurement values represented by solid squares refer to a conventional method developed by IMEC (hereinafter referred to as the "IMEC comparison method") as described in the article "Towards highly efficient industrial cells and modules from polycrystalline wafers," by F. Duerinckx, L. Frisson, P. P. Michiels et al., published at the 17th European Photovoltaic Solar Energy conference, Oct. 22–26, 2001, Munich, Germany.

In the IMEC comparison method, the etching solution comprises HF, $HNO_3$ and several additives. The temperature of the etching solution is 21 degrees Celsius. The silicon wafers remain in the etching solution for 3 minutes.

It will be appreciated from the graph of FIG. 5 that the reflection values obtained with inventively textured silicon wafers 1, which yield an average reflectance of 23.8%, particularly beginning at wavelengths of about 600 nm, are up to about 2.5% lower than those obtained with silicon wafers textured according to the IMEC comparison method, which exhibited an average reflectance of 24.9%.

The following table juxtaposes important properties for the inventively textured silicon wafers 1 (UKN isotexture) and silicon wafers textured by the IMEC comparison method (IMEC isotexture), compared in each case to texturing with a basic NaOH solution.

|  | UKN Isotexture | | | | IMEC Isotexture | | | |
| --- | --- | --- | --- | --- | --- | --- | --- | --- |
|  | FF % | $J_{SC}$ mA/$cm^2$ | $V_{OC}$ mV | Eta % | FF % | $J_{SC}$ mA/$cm^2$ | $V_{OC}$ mV | Eta % |
| NaOH | 76.3 | 31.2 | 615.9 | 14.6 | 77.9 | 30.5 | 620 | 14.8 |
| Isotexture | 76.6 | 33.2 | 614.1 | 15.6 | 77.9 | 31.6 | 614 | 15.2 |
| Relative improvement [%] | 0.4 | 5.4 | −0.3 | 6.8 | 0 | 3.6 | −1 | 2.7 |

The data for the IMEC isotexture are derived from Duerinckx et al.
For each of the above sets of silicon wafers:
FF = fill factor,
$J_{SC}$ = short-circuit current density,
$V_{OC}$ = open terminal voltage and
Eta = efficiency.

Figure 6:
FIG. 6 is an electron microscope representation of one surface of an inventively textured silicon wafer.

FIG. 6 is an enlarged photographic depiction of one surface of an inventively textured silicon wafer 1, with a scale notation. It can be seen from FIG. 6 that texturing according to the inventive method leads in part to comparatively elongated, ribbon-like depressions in a distinctly reflection-reducing surface structure.

It is understood that the inventive method can also be used with monocrystalline silicon wafers or silicon wafers pulled directly from the melt, so-called sheet silicon.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A method for texturing surfaces of silicon wafers comprising the steps of dipping said silicon wafers in an etching solution of water, concentrated hydrofluoric acid and concentrated nitric acid and setting a temperature for the etching solution, wherein said etching solution consists essentially of, in percent, 20% to 55% water, 10% to 40% concentrated hydrofluoric acid and 20% to 60% concentrated nitric acid and the temperature of said etching solution is between 0 and 15 degrees Celsius.

2. The method as in claim 1, wherein said etching solution consists essentially of, in percent, 30% to 40% water, 15% to 30% concentrated hydrofluoric acid and 30% to 50% concentrated nitric acid.

3. The method as in claim 1, wherein the temperature of said etching solution is between 7 and 9 degrees Celsius.

4. The method as in claim 1, wherein said silicon wafers remain in said etching solution for between 3 and 5 minutes.

5. The method as in claim 1, wherein said etching solution consists essentially of, in percent, 31% water, 23% concentrated hydrofluoric acid and 46% concentrated nitric acid, in that the temperature of said etching solution is 8 degrees Celsius, and said silicon wafers remain in said etching solution for between 1.5 and 2 minutes.

6. The method as in claim 1, wherein said silicon wafers are oriented substantially vertically and said etching solution has a flow component.

7. The method as in claim 1, wherein said silicon wafers are oriented substantially horizontally and said etching solution is quiescent.

8. The method as in claim 7, wherein said silicon wafers are moved through said etching solution.

9. The method as in claim 1, wherein said silicon wafers are polycrystalline.

* * * * *